(12) United States Patent
De Natale et al.

(10) Patent No.: US 10,788,535 B2
(45) Date of Patent: Sep. 29, 2020

(54) METHOD FOR DETERMINING THE OPERATING STATUS OF A MV SWITCHING APPARATUS OF THE ELECTROMAGNETIC TYPE

(71) Applicant: ABB Schweiz AG, Baden (CH)

(72) Inventors: Gabriele Valentino De Natale, Milan (IT); Marco Testa, Dalmine (IT); Andrea Ricci, Dalmine (IT); Andrea Bianco, Sesto San Giovanni (IT)

(73) Assignee: ABB Schweiz AG, Baden (CH)

( * ) Notice: Subject to any disclaimer, the term of this patent is extended or adjusted under 35 U.S.C. 154(b) by 258 days.

(21) Appl. No.: 15/542,627

(22) PCT Filed: Dec. 28, 2015

(86) PCT No.: PCT/EP2015/081265
§ 371 (c)(1),
(2) Date: Jul. 10, 2017

(87) PCT Pub. No.: WO2016/110426
PCT Pub. Date: Jul. 14, 2016

(65) Prior Publication Data
US 2018/0267103 A1    Sep. 20, 2018

(30) Foreign Application Priority Data
Jan. 9, 2015   (EP) .................................... 15150612

(51) Int. Cl.
*G01R 31/327* (2006.01)
*G01R 27/26* (2006.01)
(Continued)

(52) U.S. Cl.
CPC ..... *G01R 31/3275* (2013.01); *G01R 27/2605* (2013.01); *G01R 31/2829* (2013.01); *H02H 3/044* (2013.01); *H01H 47/002* (2013.01)

(58) Field of Classification Search
None
See application file for complete search history.

(56) References Cited

U.S. PATENT DOCUMENTS

2006/0098375 A1* 5/2006 Lluch ................... H01H 47/325
361/139
2009/0251011 A1* 10/2009 Suardi ................... H01H 33/38
307/143

(Continued)

FOREIGN PATENT DOCUMENTS

CN    101095205 A    12/2007
CN    101552143 A    10/2009
(Continued)

OTHER PUBLICATIONS

Borlotti et al.; An improved control device and method thereof; Publication Date: Jun. 19, 2002; ABB T&D Technology Ltd.; CPC:H02H Mar. 2004 (Year: 2002).*

(Continued)

*Primary Examiner* — Nasima Monsur
(74) *Attorney, Agent, or Firm* — Taft Stettinius & Hollister LLP; J. Bruce Schelkopf

(57) ABSTRACT

A method is provided for determining the operating status a MV switching apparatus. The method includes providing a test signal to the test winding for an observation period of time, the test signal having a waveform capable of exciting the magnetic element; obtaining first measuring data indicative of a voltage at first terminals of the capacitor bank during the observation period of time; obtaining second measuring data indicative of a voltage at second terminals of the test winding and indicative of a current circulating along the test winding during the observation period of time; and, calculating estimation data indicative of the operating status of the capacitor bank at the end of the observation period of time on the basis of the first and second measuring data, the (Continued)

first estimation data comprising a first estimation value indicative of the capacitance of the capacitor bank.

20 Claims, 7 Drawing Sheets

(51) Int. Cl.
    *H02H 3/04*     (2006.01)
    *G01R 31/28*     (2006.01)
    *H01H 47/00*     (2006.01)

(56) References Cited

U.S. PATENT DOCUMENTS

2012/0281331 A1* 11/2012 Usai ............... H01H 47/325
                                              361/160
2012/0319476 A1* 12/2012 De Natale ............ H01H 47/002
                                              307/19
2013/0335174 A1* 12/2013 Kodama .............. H01H 47/002
                                              335/2

FOREIGN PATENT DOCUMENTS

| CN | 103518245 A | 1/2014 |
| EP | 1215792 A1 | 6/2008 |
| EP | 2107583 A1 | 10/2009 |
| EP | 2365507 A1 | 9/2011 |

OTHER PUBLICATIONS

International Search Report and Written Opinion for Application Serial No. PCT/EP2016/081266, completed Apr. 4, 2016, 12 pages.
Chinese Office Action dated Jul. 25, 2019 in Chinese Appln. No. 201580072711.2 (10 pages).

* cited by examiner

METHOD FOR DETERMINING THE OPERATING STATUS OF A MV SWITCHING APPARATUS OF THE ELECTROMAGNETIC TYPE

FIELD OF THE INVENTION

The present invention relates to the field of switching apparatuses for medium voltage applications, such as circuit breakers, contactors, disconnectors, reclosers or the like.

For the purposes of the present invention, the term medium voltage (MV) identifies voltages higher than 1 kV AC and 1.5 kV DC up to some tens of kV, e.g. up to 72 kV AC and 100 kV DC.

The present invention relates to a method for determining the operating status of a MV switching apparatus of the electromagnetic type.

More particularly, the present invention relates to a method for determining the operating status a capacitor bank feeding the electromagnetic actuator of the switching apparatus.

BACKGROUND

As is known, a MV switching apparatus of the electromagnetic type comprises an electromagnetic actuator for coupling or uncoupling the electric contacts of the electric poles, during switching operations.

In some known MV switching apparatuses, the electromagnetic actuator comprises a magnetic core provided with an excitation winding and a movable plunger mechanically coupled to the mobile contacts of the electric poles.

In other MV switching apparatuses of known type, the electromagnetic actuator comprises an electric motor (e.g. a brushless motor) having a plurality of excitation windings (stator windings).

A kinematic chain mechanically couples the electric motor with the electric contacts of the switching apparatus, which can thus be operated between the mentioned coupling and uncoupling positions.

A MV switching apparatus of electromagnetic type generally comprises power supply means to provide electric power to the electromagnetic actuator and a capacitor bank adapted to store electrical energy to feed the electromagnetic actuator.

As is known, it is quite important to properly monitor the operating status of the capacitor bank, since this latter is a crucial component to ensure a correct and safe operation of the switching apparatus.

Obtaining incomplete or wrong information about the operating status of the capacitor bank may lead to relevant fault events. As an example, if the capacitor bank has a capacitance value lower than expected, the electromagnetic actuator may not be properly energized and the electric contacts of the switching apparatus may be wrongly actuated, thereby causing the raising of internal arc phenomena and consequent extended damages.

In most of the switching apparatuses of known type, dedicated sensing circuits are employed to monitor the operating status of the capacitor bank.

These circuits typically comprise sensors, accessory devices and additional wirings to the capacitor bank.

Such solutions have the main drawback of increasing the overall size of the switching apparatus and the costs to manufacture the switching device at industrial level.

SUMMARY

The main aim of the present invention is to provide a method for determining the operating status of a MV switching apparatus that allows overcoming the drawbacks of the known art.

Within this aim, a purpose of the present invention is to provide a method, which allows obtaining reliable information about the operating status of the capacitor bank of said MV switching apparatus.

A further purpose of the present invention is to provide a method that is relatively simple to be implemented practically, at relatively low costs.

The above aim and purposes, as well as other purposes that will emerge clearly from the following description and attached drawings, are provided according to the invention by a method for determining the operating status of a MV switching apparatus, according to the following claim 1 and the related dependent claims.

In a further aspect, the present invention provides a method for controlling a MV switching apparatus, according to the following claim 6.

In a further aspect, the present invention relates to a MV switching apparatus according to the following claim 7 and the related dependent claims.

In a further aspect, the present invention relates to a power and control unit for a MV switching apparatus according to the following claim 12.

Further characteristics and advantages of the method, according to the present invention, will become more apparent from the detailed description of preferred embodiments illustrated only by way of non-limitative example in the accompanying drawings, in which:

DETAILED DESCRIPTION

Figure 1:
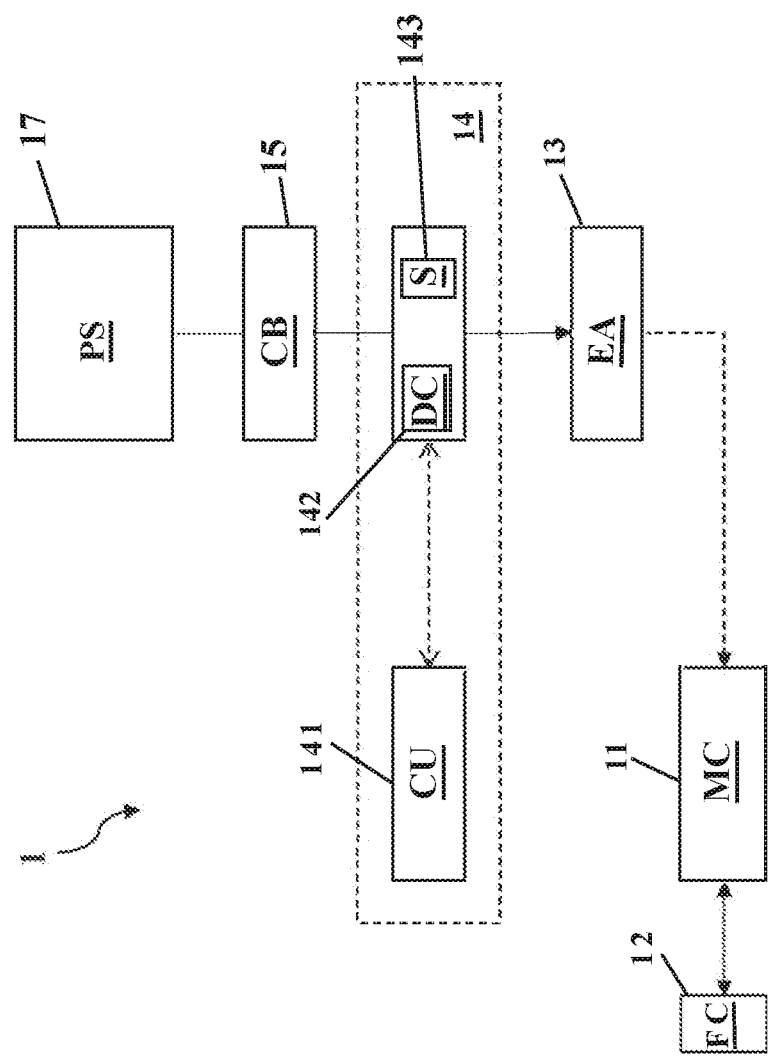
FIGS. 1-5 are block diagrams that schematically show some embodiments of a MV switching apparatus according to an aspect of the invention.

Referring to the cited figures, the present invention is related to a method 100 for determining the operating status of a MV switching apparatus 1.

The MV switching apparatus 1 comprises one or more electric poles, each of which comprises a movable contact 11 and a fixed contact 12, which are electrically connected to a conductor (e.g. a phase conductor) of a power distribution line (not shown).

The movable contact 11 and the fixed contact 12 are adapted to be coupled or uncoupled respectively during the switching operations of the switching apparatus 1.

A switching operation may be a closing operation, in which the contacts 11, 12 are brought from an uncoupled state to a coupled state, or an opening operation, in which the contacts 11 and 12 are brought from a coupled state to an uncoupled state.

When the contacts 11, 12 are in a coupled or uncoupled state, the switching apparatus 1 is respectively in a closing or an opening condition.

The switching apparatus 1 comprises an electromagnetic actuator 13 that is operatively coupled to the movable contacts 11 of the electric poles through a kinematic chain (not shown).

In some embodiments of the invention (FIGS. 2-3), the electromagnetic actuator 13 may be a known actuator of the SCA (Single Coil Actuator) type.

In this case, the electromagnetic actuator 13 comprises an excitation winding 132, a magnetic core 131 and a movable plunger 133 that is operatively coupled to the movable contacts through a kinematic chain (not shown).

During a switching operation of the switching apparatus 1, an excitation current circulates in the excitation winding 132 to generate a magnetic flux.

The movable plunger 133 is operated by a force, which is generated by the magnetic flux enchained with the magnetic core 131. The plunger 133 is moved between two positions, which correspond to a coupled state or uncoupled state of the electric contacts 11, 12 and, therefore, to a closing or opening condition of the switching apparatus 1.

In other embodiments of the invention (FIG. 4), the electromagnetic actuator 13 may be a known three-phase electric motor, preferably of the brushless type.

Figure 4:
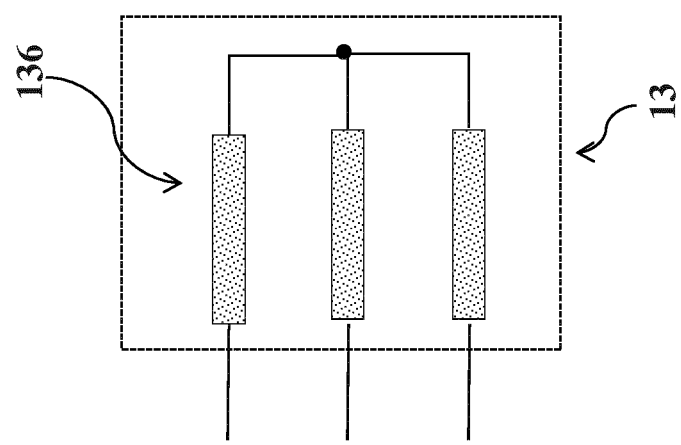
Figure 5:
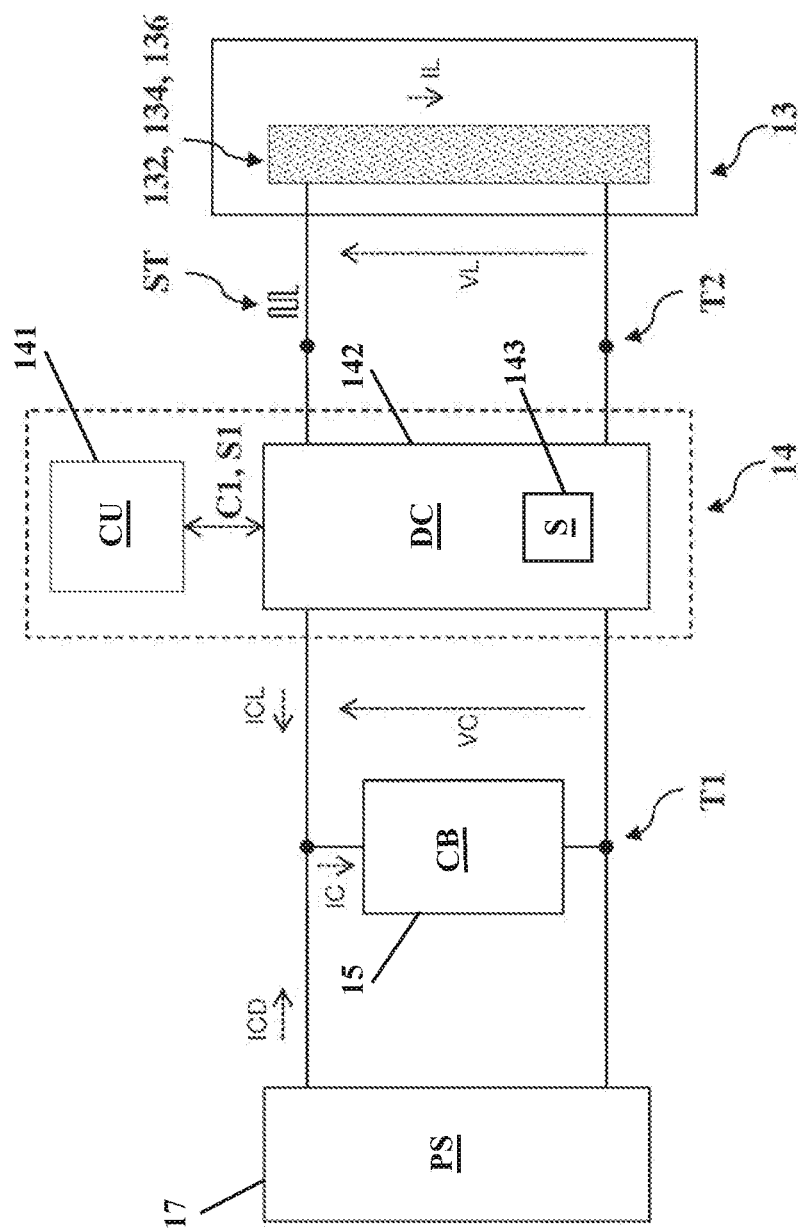

In this case, as shown in FIG. 4, the electromagnetic actuator 13 advantageously comprises three excitation windings 136 forming the stator windings.

During a switching operation of the switching apparatus 1, the electric motor is operated between two positions, which correspond to a coupled state or uncoupled state of the electric contacts 11, 12 and, therefore, to a closing or opening condition of the switching apparatus 1.

Preferably, the switching apparatus 1 comprises power supply means 17 that supply electric power to energize the excitation windings 132, 136 of the electromagnetic actuator 13 during a switching operation.

The switching apparatus 1 further comprises a capacitor bank 15 that is adapted to store electric energy for operating the electromagnetic actuator 13.

The capacitor bank 15 is advantageously of the electrolytic type and it may comprise one or more storage capacitors.

The power supply means 17 are electrically connected to the capacitor bank 15 to feed this latter.

To this aim, the capacitor bank 15 (which, as a whole, may be considered as a circuit component) comprises first terminals T1, at which it is electrically connected to the power supply means 17.

In normal conditions, the capacitor bank 15 is continuously charged by the power supply means 17 and is in turn capable of continuously feeding the electromagnetic actuator 13.

In emergency conditions (e.g. due to a fault), the power supply means 17 may be not available anymore. In this case, the capacitor bank 15 is no more charged and it is capable of providing electric power for a residual time interval only, during which the electromagnetic actuator 13 can execute emergency maneuvers.

The switching apparatus 1 comprises a power and control unit 14 for controlling the operations of the switching apparatus 1.

Preferably, the power and control unit 14 comprises a computerized unit 141 (which may include one or more digital processing devices, e.g. one or more microprocessors) adapted to execute software instructions to generate control/data signals to manage the operating life of the switching apparatus 1.

Preferably, the power and control unit 14 comprises a driving circuit 142 is electrically connected to the power supply means 17 and to the electromagnetic actuator 13.

In general terms, the driving circuit 142 is adapted to receive electric power from the power supply means 17 and provide suitable excitation currents to the excitation windings 132, 136 of the electromagnetic actuator 13.

The driving circuit 142 is directly or indirectly controlled by the computerized unit 141.

Preferably, the computerised unit 141 is adapted to provide suitable control signals C1 to control the operation of the active components (e.g. one or more power switches) of the driving circuit 142.

As an alternative, the driving circuit 142 may be controlled by a dedicated control circuit that is in turn controlled by the computerized unit 141.

Advantageously, the driving circuit 142 comprises sensing means 143 adapted to provide sensing signals S1 indicative of electrical quantities present in said driving circuit.

Preferably, the sensing means 143 comprise voltage sensors adapted to provide sensing signals indicative of the voltages respectively at the input and output terminals of the driving circuit 142 and current sensors adapted to provide sensing signals indicative of the currents provided to the electromagnetic actuator 13.

Preferably, the computerized unit 141 is adapted to receive the sensing signals S1 from the sensing means 143.

Preferably, input terminals of the driving circuit 142 are electrically connected to the first terminals T1 of the capacitor bank 15.

The driving circuit 142 is thus adapted to receive electric power from the capacitor bank 15, which is in turn charged by the power supply means 17.

According to the invention, the electromagnetic actuator 13 comprises at least a test winding wound around a corresponding magnetic element.

Preferably, said test winding is electrically connected to the driving circuit 142 of the power and control unit 14.

Preferably, said test winding is formed by at least an excitation winding 132, 136 of the electromagnetic actuator 13.

Figure 2:
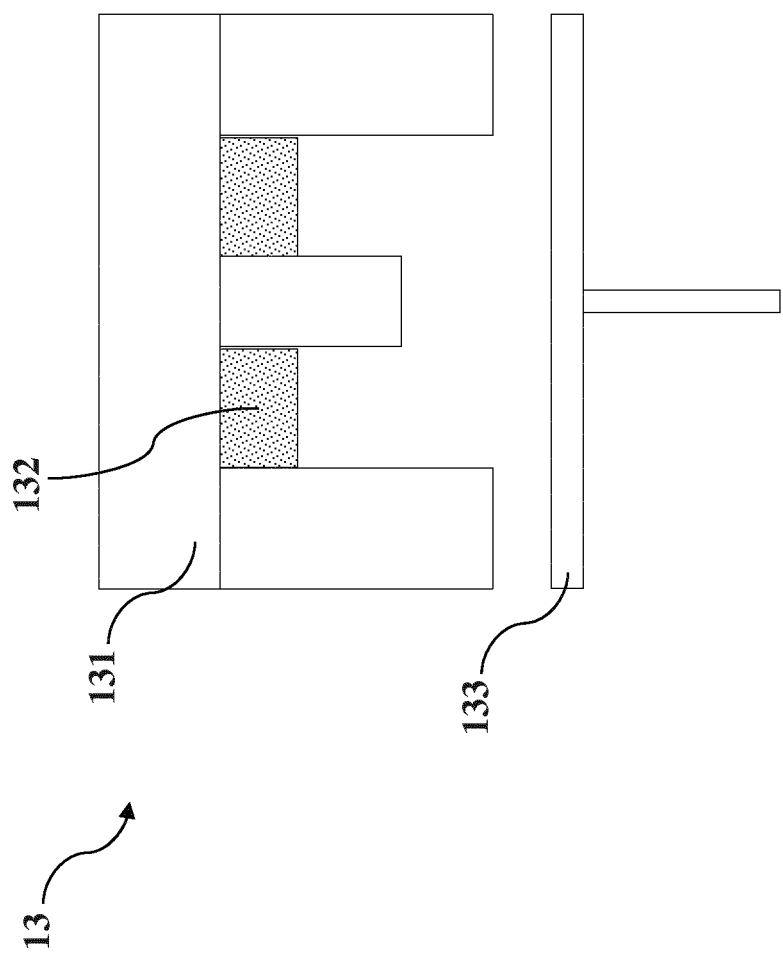

In the embodiment of FIG. 2, said test winding is preferably formed by the main excitation winding 132 of the actuator 13 of SCA type and the corresponding magnetic element is formed by the magnetic core 131.

In the embodiment of FIG. 4, said test winding is preferably formed by at least one of the main excitation windings 136 of the electric motor 13 and the magnetic element is formed by the corresponding stator magnetic pole of said electric motor.

In alternative embodiments of the present invention, said test winding may be formed by a dedicated winding different from the main excitation windings 132, 136.

Figure 3:
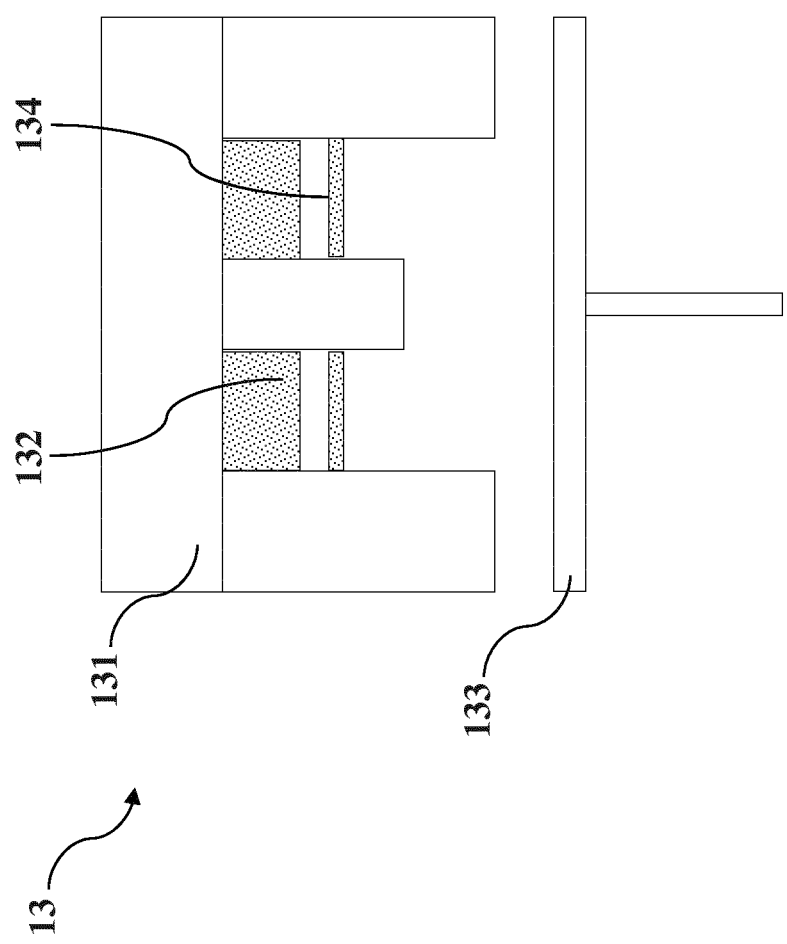

As an example, in the embodiment of FIG. 3, the actuator 13 of the SCA type comprises a test winding 134 formed by an additional winding coiled around the magnetic core 131.

A similar solution may be adopted, when the electromagnetic actuator 13 is an electric motor.

The test winding 132, 134, 136 (which, as a whole, may be considered as a circuit component) is advantageously provided with second terminals T2.

Preferably, output terminals of the driving circuit 142 are electrically connected to the second terminals T2 of the test winding 132, 134, 136.

According to the invention, the power and control unit 14 is adapted to provide one or more test signals ST to the test winding 132, 134, 136.

For the sake of clarity, it is evidenced that the test signals ST are different from the excitation currents provided to the excitation windings 132, 136 to operate the actuator 13 during a switching operation of the switching apparatus 1.

The test signals ST are electric signals (voltage or current signals) having a very small magnitude (amplitude or intensity) and a completely different waveform with respect to said excitation currents.

Advantageously, the driving circuit 142 is adapted to receive suitable control signals from the computerized unit 141 to provide the test signals ST to the test winding 132, 134, 136.

Figure 6:
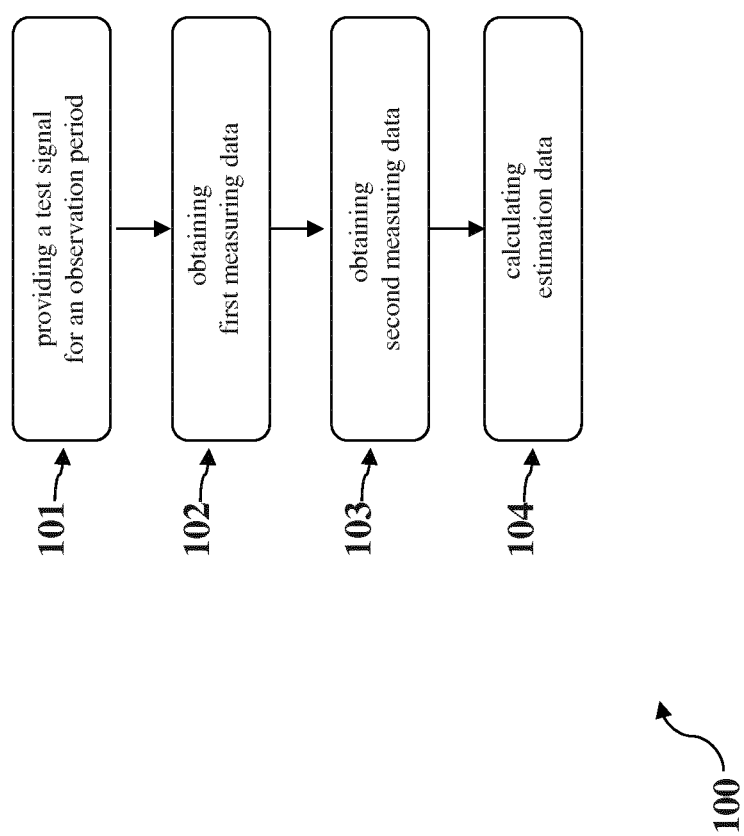
FIGS. 6-7 are block diagrams that schematically show an embodiment of the method, according to the present invention.
Figure 7:
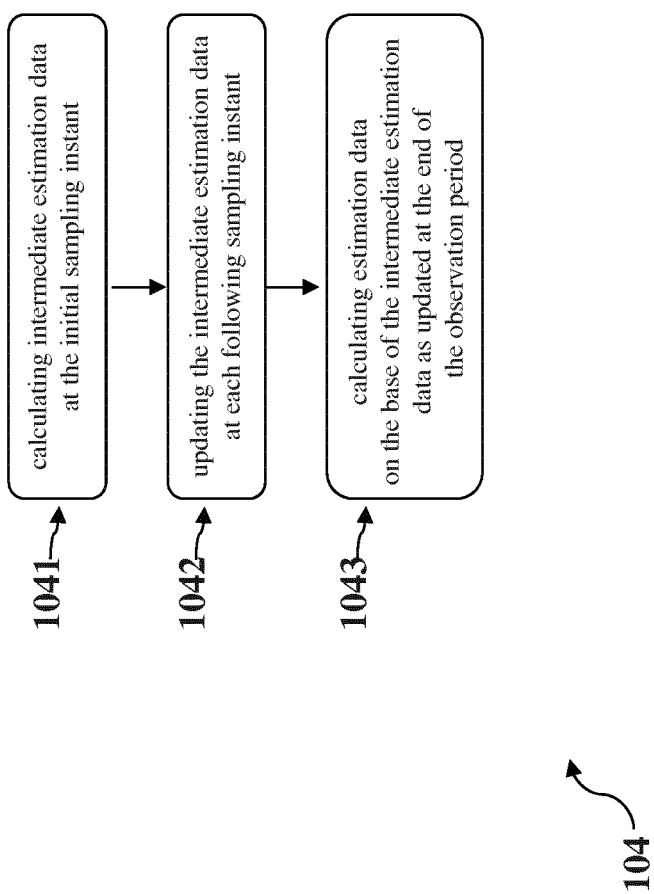

Referring now to FIG. 6, the method 100, according to the invention, comprises the following steps:

- the step 101 of providing a test signal ST to the test winding 132, 134, 136 for an observation period of time $T_O$;
- the step 102 of obtaining first measuring data $V_C$ indicative of a voltage at the terminals T1 of the capacitor bank 15 during the observation period of time $T_O$;
- the step 103 of obtaining second measuring data $V_L$, $I_L$ indicative of a voltage at second terminals T2 of the test winding 132, 134, 136 and/or indicative of a current circulating along said test winding during the observation period of time $T_O$;
- the step 104 of calculating estimation data indicative of the operating status of the capacitor bank 15 at the end of the observation period of time $T_O$ on the base of the first and second measuring data $V_C$, $V_L$, $I_L$.

Referring to the step 101 of the method 100, the test signal ST has a waveform capable of exciting the magnetic element (e.g. the magnetic core 131) of the electromagnetic actuator 13, around which the test winding 132, 134, 136 is wound.

Preferably, the test signal ST is a signal having a pulsed waveform. In this case, the frequency, duty-cycle and amplitude of the pulses of the test signal ST are advantageously selected on the base of the magnetic characteristics of the magnetic element.

Preferably, the test signal ST is a voltage signal that is applied at the terminals T2 of the test winding 132, 134, 136 and that determines the circulation of a current along this latter.

The test winding 132, 134 is constantly fed with the test signal ST during the observation period of time $T_O$, which may be, as an example, of 100 ms.

In the practical implementation of the step 101 of the method 100, the power and control unit 14 is adapted to provide the test signal ST.

In particular, the computerised unit 141 is adapted to execute software instructions to provide control signals to the driving circuit 142 in order to send the test signal ST to the test winding 132, 134, 136.

Referring now to the steps 102-103 of the method 100, the switching apparatus 1 comprises sensing means 143 to acquire the measuring data $V_C$, $V_L$, $I_L$.

The sensing means 143 are advantageously adapted to provide the computerised unit 141 with sensing signals related to the detected electrical quantities.

Preferably, the sensing means 143 are comprised in the driving circuit 142.

Preferably, the sensing means 143 comprise a first voltage sensor to detect the voltage at the terminals T1 of the capacitor bank 15.

Preferably, the sensing means 143 comprise a second voltage sensor and a first current sensor to detect both the current circulating in the test winding 132, 134, 136 and the voltage applied at the terminals T2 of this latter.

In some embodiments of the invention, the sensing means may merely comprise just one of said second voltage sensor and first current sensor to detect the voltage applied at the terminals T2 of the test winding 132, 134, 136 or the current circulating in this latter, only.

This solution may be used when data related to the amplitude or intensity of the applied voltage or current test signal are already available to the computerized unit 141.

In the practical implementation of the step 102 of the method 100, the computerised unit 141 is adapted to receive the sensing signals transmitted by the sensing means 143 and obtain the measuring data $V_C$, $V_L$, $I_L$.

In particular, said measuring data are obtained by the computerised unit 141 that execute suitable software instructions to process the sensing signals received from the sensing means 143.

Preferably, in a digital implementation of the method 100, the measuring data $V_C$, $V_L$, $I_L$ are obtained at a plurality of subsequent sampling instants comprised in the observation period $T_O$ set by the computerised unit 141.

Advantageously, the computerised unit 141 sets a sampling period $T_S$ (e.g. 0.1 ms) that is quite shorter than the observation period $T_O$.

The following important aspect of the present invention is evidenced.

As the method 100 provides for the acquisition of the first and second measuring data $V_C$, $V_L$, $I_L$ described above, there is no need to arrange dedicated sensing means for its practical implementation, in particular for the practical implementation of the steps 102-103.

The sensing means 143 that already resident in the driving circuit 142, which are mainly used by the power and control unit 14 to manage the operation of the electromagnetic actuator 13 through the driving circuit 142, can be conveniently used for implementing the method 100.

This is possible thanks to the fact that the first and second measuring data $V_C$, $V_L$, $I_L$ relate to the voltage at the terminals T1 of the capacitor bank and to the voltage and current at the terminals T2 of the test winding 132, 134, 136.

Referring now to the step 104 of the method 100, the mentioned estimation data comprise at least a first estimation value $\hat{C}$ indicative of the capacitance of the capacitor bank 15.

Preferably, said estimation data comprise multiple different estimation value indicative of the electrical behaviour of the capacitor bank 15.

Preferably, the estimation data comprise also a second estimation value $I_{CD}$ indicative of a disturbance current, which circulates in the capacitor bank 15 during the observation period of time $T_O$.

From a physical point of view, the disturbance current $I_{CD}$ is the current that circulates in the capacitor bank 15 and that is not employed to feed the electromagnetic actuator 13.

As an example, the disturbance current $I_{CD}$ may be the current used to feed loads different from the electromagnetic actuator 13, e.g. a current fed by the power supply 17 or other loads (not shown) connected to the capacitor bank 15.

Preferably, the estimation data comprise also a third estimation value $I_C$ indicative of the overall current, which circulates in the capacitor bank 15 during the observation period of time $T_O$.

At any generic instant (t), the current $I_C$ circulating in the capacitor bank 15 can be calculated on the base of the following relation:

$$I_C(t) = I_{CL}(t) + I_{CD}(t)$$

where $I_{CL}$ is the current component, which circulates in the capacitor bank 15 to feed the electromagnetic actuator 13, and the $I_{CD}$ is the current component, which circulates in the capacitor bank 15 and is not employed to feed the electromagnetic actuator 13.

At any generic instant (t), the current component $I_{CL}$ can be calculated on the base of the first and second measuring data on the base of the following approximation relation:

$$V_C(t)*I_{CL}(t) = -I_L(t)*V_L(t)$$

in which the electric power adsorbed by the driving circuit 142 is considered as negligible. It is evidenced that the estimation data $\hat{C}$, $I_{CD}$, $I_C$ relate to the electric behaviour of the capacitor bank 15 at the end of observation period $T_O$, i.e. after said observation parameters have reached stable convergence values during a stimulation process of the test winding 132, 134, 136 by means of the test signal ST.

As mentioned above, the estimation data $\hat{C}$, $I_{CD}$, $I_C$ are calculated on the base of first and second measuring data $V_C$, $V_L$, $I_L$ described above, which are preferably acquired at the sampling instants set by the computerised unit 141.

Preferably, the step 104 of the method 100 comprises a recursive calculation procedure to calculate the estimation data $\hat{C}$, $I_{CD}$, $I_C$.

Said calculation procedure comprises the step 1041 of calculating intermediate estimation data $\hat{\theta}_0$, $\hat{\theta}_1$ indicative of the operating status of the capacitor bank 15 at an initial sampling instant comprised in said observation period of time $T_O$. At this step, the estimation data $\hat{\theta}_0$, $\hat{\theta}_1$ are calculated data basing on the first and second measuring data $V_C$, $V_L$, $I_L$ obtained at said initial sampling instant.

Said calculation procedure comprises the step 1042 of updating the intermediate estimation data $\hat{\theta}_0$, $\hat{\theta}_1$ at each subsequent sampling instant following said initial sampling instant up to the end of the observation period of time $T_O$. The estimation data $\hat{\theta}_0$, $\hat{\theta}_1$ are, time by time, updated on the base of the measuring data $V_C$, $V_L$, $I_L$ obtained at each corresponding sampling instant subsequent to the initial sampling instant.

Said calculation procedure comprises the step 1043 of calculating the estimation data $\hat{C}$, $I_{CD}$, $I_C$ basing on the intermediate estimation data $\hat{\theta}_0$, $\hat{\theta}_1$ calculated for the last sampling instant comprised in the observation period of time $T_O$.

In an exemplary embodiment of the present invention, said recursive calculation procedure is advantageously based on the following discrete second order mathematical model of the capacitor bank 15:

$$V_C(t) = I_C(t-1) + \frac{T_s}{C} I_C(t-1)$$

where $I_C$ is the current circulating in the capacitor bank 15, $V_C$ is the voltage at the terminals T1 of the capacitor bank, C is the overall capacitance of the capacitor bank, $T_S$ is the sampling period and t, t−1 are subsequent generic sampling instants.

By defining the following vectors:

$$\phi(t-1) = \begin{bmatrix} I_{CL}(t-1) \\ 1 \end{bmatrix}, \theta = \begin{bmatrix} \frac{T_s}{C} \\ \frac{T_s}{C} I_{CD} \end{bmatrix}$$

the mathematical model described above, can be updated from a sampling instant (t−1) to another (t) on the base of the following updating equation:

$$y(t) = \phi(t-1)^T \theta$$

where y(t) is the system output referring to the sampling instant t, $\phi(t-1)$ is the regression vector at the preceding sampling instant t−1 and θ is the unknown vector of intermediate estimation data at the sampling instant t.

In order to update the intermediate estimation data $\hat{\theta}_0$, $\hat{\theta}_1$ at each sampling instant up to the end of the observation period $T_O$, the following mathematical equations can be used:

$$\hat{\theta}(t) = \hat{\theta}(t-1) + \frac{P(t-2)\phi(t-1)}{1 + \phi(t-1)^T P(t-2)\phi(t-1)} \left[ y(t) - \phi(t-1)^T \hat{\theta}(t-1) \right]$$

$$P(t-1) = P(t-2) + \frac{P(t-2)\phi(t-1)\phi(t-1)^T P(t-2)}{1 + \phi(t-1)^T P(t-2)\phi(t-1)}$$

where P(t−1), P(t−2) are values of the gain matrix evaluated at the sampling instants t−1 and t−2 that precede the sampling instant t, respectively.

It is evidenced that, at the generic instant (t−1), the regression vector $\phi(t-1)$ is calculated on the base of the first and second measuring data $V_C$ (t−1), $V_L$ (t−1), $I_L$ (t−1) as measured at the instant (t−1) while, at the subsequent instant (t), the regression vector $\phi(t)$ is calculated on the base of the first and second measuring data $V_C$ (t), $V_L$ (t), $I_L$ (t) as measured at the instant (t).

In other words, the regression vector is calculated at each sampling instant on the base of the first and second measuring data by employing the relation for calculating the current component $I_{CL}$ described above.

Once the vector of intermediate estimation data $$\hat{\theta} = \begin{bmatrix} \hat{\theta}_0 \\ \hat{\theta}_1 \end{bmatrix}$$

at the end of the observation period $T_O$ (i.e. at the last sampling instant comprised in the observation period $T_O$) has been calculated, the estimation values $\hat{C}$, $I_{CD}$ may be advantageously given by the following equations:

$$\hat{C} = \frac{T_s}{\hat{\theta}_0}, I_{CD} = \frac{\hat{\theta}_1}{\hat{\theta}_0}$$

The third estimation value $I_C$, which is indicative of the current circulating in the capacitor bank 15, can be calculated on the base of the second estimation value $I_{CD}$ and on the base of the current component $I_{CL}$, as calculated at the last sampling instant comprised in said observation period of time $T_O$.

The method 100 can thus provide, at the end of the observation period $T_O$, data related to all the electrical quantities $\hat{C}$, $V_C$, $I_C$ describing the electrical behaviour of the capacitor bank 15. The data related to the electrical quantity $V_C$ are measured on the field whereas the data related to the electrical quantities C, $I_C$ are estimated, preferably through the processing steps 1041-1043 described above.

In the practical implementation of the step 104 of the method 100, the power and control unit 14 is adapted to calculate the estimation data Ĉ, $I_{CD}$, $I_C$. In particular, the computerised unit 141 is capable of executing suitable software instructions to implement the processing steps 1041-1043 (such those described above) to calculate said estimation data.

The method 100, according to the invention, is advantageously executed when the switching device 1 does not perform a switching operation, i.e. it is in a closing or open condition.

Preferably, the method 100 may be cyclically executed with a given repetition period.

The method 100 allows determining the actual operating status of the capacitor bank 15 before the execution of a switching operation.

The estimation data provided by the method 100 may be conveniently employed in methods for controlling the operation of the switching apparatus 1.

For example, the power and control unit 14 may use the diagnostic information related to the actual capacitance of the capacitor bank 15 (first estimation value Ĉ) to properly control and adjust the energisation process of the electromagnetic actuator 13.

The method 100, according to the present invention, provides remarkable advantages with respect to the solutions of the state of the art.

The method 100 provides advanced estimation data indicative of the operating status of the capacitor bank that feeds the electromagnetic actuator of the MV switching apparatus.

Said diagnostic information can be acquired without the arrangement of dedicated sensors.

In other words, the method 100 employs sensors that are normally present in the switching device to acquire the requested diagnostic information.

This allows reducing the overall size and production costs of the switching apparatus 1 with respect to corresponding solutions of the state of the art, since the arrangement of dedicated position sensors and the related cabling are no more needed.

The method 100 is particularly suitable for use in a method for controlling the switching apparatus 1.

The diagnostic information provided by the method 100 can be easily acquired and processed to properly manage the switching operations of the switching apparatus 1 in consideration of the actual operative status of the capacitor bank 15. This allows considerably improving the overall reliability and efficiency of the switching operations of the switching apparatus 1.

The diagnostic information provided by the method 100 can be further used to determine the presence of possible problems in the capacitor bank 15. As an example, it can be used to identify efficiency losses or to estimate the residual life of the capacitor bank.

The method 100 can be easily implemented in practice and it requires relative small calculation resources for being carried out by the power and control unit 14 of the switching apparatus.

The invention claimed is:

1. A method for determining an operating status of a capacitor bank of a MV switching apparatus, the switching apparatus comprising: one or more electric poles, each comprising a movable contact and a fixed contact adapted to be coupled and uncoupled during the switching operations of the switching apparatus; an electromagnetic actuator for actuating one or more movable contacts of the electric poles, the electromagnetic actuator having at least a test winding wound around a magnetic element; and the capacitor bank for providing electric power to electromagnetic actuator;

the method comprises the following steps:

providing a test signal (ST) to said test winding for an observation period of time (To), said test signal having a waveform capable of exciting said magnetic element;

receiving a first sensing signal indicative of a first electrical quantity (VC) at first terminals (T1) of said capacitor bank during said observation period of time from sensor means of said MV switching apparatus;

receiving a second sensing signal indicative of a second electrical quantity (VL, IL) at second terminals (T2) of said test winding of the electromagnetic actuator during said observation period of time from the sensor means of said MV switching apparatus;

calculating first measuring data (Vc) indicative of a voltage at the first terminals (T1) of said capacitor bank during said observation period of time by processing said first sensing signal;

calculating second measuring data (VL, IL) indicative of a voltage at the second terminals (T2) of said test winding of the electromagnetic actuator and/or indicative of a current circulating along said test winding of the electromagnetic actuator during said observation period of time by processing said second sensing signal;

calculating estimation data (C, Icd, Ic) indicative of the operating status of said capacitor bank at the end of said observation period of time by using said first and second measuring data at different instants within said observation period, said estimation data comprising a first estimation value (C) indicative of the capacitance of said capacitor bank.

2. The method, according to claim 1, wherein said estimation data comprise a second estimation value ($I_{CD}$) indicative of a disturbance current, which circulates in said capacitor bank during said observation period of time, said disturbance current being a current that circulates in said capacitor bank and that is not employed to feed said electromagnetic actuator.

3. The method, according to claim 2, wherein said estimation data comprise a third estimation value ($I_C$) indicative of the overall current circulating in said capacitor bank.

4. The method, according to claim 1 wherein said step of calculating said estimation data (Ĉ, $I_{CD}$, $I_C$) comprises the following steps:

calculating intermediate estimation data ($\hat{\theta}_0$, $\hat{\theta}_1$) indicative of the operating status of said capacitor bank at an initial sampling instant comprised in said observation period of time ($T_O$), said intermediate estimation data being calculated basing on the first and second measuring data ($V_C$, $V_L$, $I_L$) obtained at said initial sampling instant;

updating said intermediate estimation data ($\hat{\theta}_0$, $\hat{\theta}_1$) at each subsequent sampling instant following said initial sampling instant up to the end of said observation period of time ($T_O$), said intermediate estimation data being updated basing on the first and second measuring data ($V_C$, $V_L$, $I_L$) obtained at each subsequent sampling instant;

calculating said estimation data (Ĉ, $I_{CD}$, $I_C$) basing on the intermediate estimation data ($\hat{\theta}_0$, $\hat{\theta}_1$) updated at the last sampling instant comprised in said observation period of time ($T_O$).

5. The method, according to claim 1 wherein said test signal (ST) is a pulsed voltage signal.

6. The method, according to claim 2, wherein said step of calculating said estimation data ($\hat{C}$, $I_{CD}$, $I_C$) comprises the following steps:
- calculating intermediate estimation data ($\hat{\theta}_0$, $\hat{\theta}_1$) indicative of the operating status of said capacitor bank at an initial sampling instant comprised in said observation period of time ($T_O$), said intermediate estimation data being calculated basing on the first and second measuring data ($V_C$, $V_L$, $I_L$) obtained at said initial sampling instant;
- updating said intermediate estimation data ($\hat{\theta}_0$, $\hat{\theta}_1$) at each subsequent sampling instant following said initial sampling instant up to the end of said observation period of time ($T_O$), said intermediate estimation data being updated basing on the first and second measuring data ($V_C$, $V_L$, $I_L$) obtained at each subsequent sampling instant;
- calculating said estimation data ($\hat{C}$, $I_{CD}$, $I_C$) basing on the intermediate estimation data ($\hat{\theta}_0$, $\hat{\theta}_1$) updated at the last sampling instant comprised in said observation period of time ($T_O$).

7. The method, according to claim 3, wherein said step of calculating said estimation data ($\hat{C}$, $I_{CD}$, $I_C$) comprises the following steps:
- calculating intermediate estimation data ($\hat{\theta}_0$, $\hat{\theta}_1$) indicative of the operating status of said capacitor bank at an initial sampling instant comprised in said observation period of time ($T_O$), said intermediate estimation data being calculated basing on the first and second measuring data ($V_C$, $V_L$, $I_L$) obtained at said initial sampling instant;
- updating said intermediate estimation data ($\hat{\theta}_0$, $\hat{\theta}_1$) at each subsequent sampling instant following said initial sampling instant up to the end of said observation period of time ($T_O$), said intermediate estimation data being updated basing on the first and second measuring data ($V_C$, $V_L$, $I_L$) obtained at each subsequent sampling instant;
- calculating said estimation data ($\hat{C}$, $I_{CD}$, $I_C$) basing on the intermediate estimation data ($\hat{\theta}_0$, $\hat{\theta}_1$) updated at the last sampling instant comprised in said observation period of time ($T_O$).

8. The method, according to claim 2, wherein said test signal (ST) is a pulsed voltage signal.

9. The method, according to claim 3, wherein said test signal (ST) is a pulsed voltage signal.

10. The method, according to claim 4, wherein said test signal (ST) is a pulsed voltage signal.

11. The method, according to claim 1, wherein the second measuring data (VL) is indicative of the voltage at the second terminals (T2) of said test winding during said observation period of time.

12. A MV switching apparatus comprising:
- one or more electric poles, each comprising a movable contact and a fixed contact adapted to be coupled and uncoupled during the switching operations of said switching apparatus;
- an electromagnetic actuator for actuating the movable contacts of the electric poles, said electromagnetic actuator having at least a test winding wound around a magnetic element;
- a capacitor bank for storing electrical energy to operate said electromagnetic actuator;
- a power and control unit for controlling the switching operations of said switching apparatus said power and control unit is adapted to: provide a test signal (ST) to said test winding for an observation period of time (ToO), said test signal having a waveform capable of exciting said magnetic element;
- receive a first sensing signal indicative of a first electrical quantities (Vc) at first terminals (T1) of said capacitor bank during said observation period of time from sensor means of said MV switching apparatus;
- receive a second sensing signal indicative of a second electrical quantity (VL, IL) at second terminals (T2) of said test winding of the electromagnetic actuator during said observation period of time from the sensor means of said MV switching apparatus;
- calculate first measuring data (Vc) indicative of a voltage at the first terminals (T1) of said capacitor bank during said observation period of time by processing said first sensing signal;
- calculate second measuring data (VL, IL) indicative of a voltage at the second terminals (T2) of said test winding of the electromagnetic actuator and/or indicative of a current circulating along said test winding of the electromagnetic actuator during said observation period of time by processing said second sensing signal;
- calculate estimation data (C, Icd, Ic) indicative of an operating status of said capacitor bank at the end of said observation period of time by using said first and second measuring data at different instants within said observation period, said estimation data comprising a first estimation value (C) indicative of the capacitance of said capacitor bank.

13. The switching apparatus, according to claim 12, wherein said estimation data comprise a second estimation value ($I_{CD}$) indicative of a disturbance current, which circulates in said capacitor bank during said observation period of time, said disturbance current being a current that circulates in said capacitor bank and that is not employed to feed said electromagnetic actuator.

14. The switching apparatus, according to claim 13, wherein said estimation data comprise calculate a third estimation value ($I_C$) indicative of the overall current circulating in said capacitor bank.

15. The switching apparatus, according to claim 12, wherein said power and control unit is adapted to:
- calculate intermediate estimation data ($\hat{\theta}_0$, $\hat{\theta}_1$) indicative of the operating status of said capacitor bank at an initial sampling instant comprised in said observation period of time ($T_O$), said intermediate estimation data being calculated basing on the first and second measuring data ($V_C$, $V_L$, $I_L$) obtained at said initial sampling instant;
- update said intermediate estimation data ($\hat{\theta}_0$, $\hat{\theta}_1$) at each subsequent sampling instant following said initial sampling instant up to the end of said observation period of time ($T_O$), said intermediate estimation data being updated basing on the first and second measuring data ($V_C$, $V_L$, $I_L$) obtained at each subsequent sampling instant;
- calculate said estimation data ($\hat{C}$, $I_{CD}$, $I_C$) basing on the intermediate estimation data ($\hat{\theta}_0$, $\hat{\theta}_1$) updated at the last sampling instant comprised in said observation period of time ($T_O$).

16. The switching apparatus, according to claim 12, wherein said test signal (ST) is a pulsed voltage signal.

17. The switching apparatus, according to 13, wherein said test signal (ST) is a pulsed voltage signal.

18. The switching apparatus, according to 14, wherein said test signal (ST) is a pulsed voltage signal.

19. The switching apparatus, according to 15, wherein said test signal (ST) is a pulsed voltage signal.

20. A power and control unit for a MV switching apparatus that comprises control means configured to execute software instructions for determining an operating status of a capacitor bank of a MV switching apparatus, the switching apparatus comprising: one or more electric poles, each comprising a movable contact and a fixed contact adapted to be coupled and uncoupled during the switching operations of the switching apparatus; an electromagnetic actuator for actuating one or more movable contacts of the electric poles, the electromagnetic actuator having at least a test winding wound around a magnetic element; and the capacitor bank for providing electric power to electromagnetic actuator; wherein the control means is adapted to:

provide a test signal (ST) to said test winding for an observation period of time (To), said test signal having a waveform capable of exciting said magnetic element;

receive a first sensing signal indicative of a first electrical quantities (Vc) at first terminals (T1) of said capacitor bank during said observation period of time from sensor means of said MV switching apparatus;

receive a second sensing signal indicative of a second electrical quantity (VL, IL) at second terminals (T2) of said test winding of the electromagnetic actuator during said observation period of time from the sensor means of said MV switching apparatus;

calculate first measuring data (Vc) indicative of a voltage at the first terminals (T1) of said capacitor bank during said observation period of time by processing said first sensing signal; calculate second measuring data (VL, IL) indicative of a voltage at the second terminals (T2) of said test winding of the electromagnetic actuator and/or indicative of a current circulating along said test winding of the electromagnetic actuator during said observation period of time by processing said second sensing signal;

calculate estimation data (C, Icd, Ic) indicative of the operating status of said capacitor bank at the end of said observation period of time by using said first and second measuring data at different instants within said observation period, said estimation data comprising a first estimation value (C) indicative of the capacitance of said capacitor bank.

\* \* \* \* \*